(12) United States Patent
Chen

(10) Patent No.: US 7,049,626 B1
(45) Date of Patent: May 23, 2006

(54) MISALIGNMENT-TOLERANT ELECTRONIC INTERFACES AND METHODS FOR PRODUCING MISALIGNMENT-TOLERANT ELECTRONIC INTERFACES

(75) Inventor: Yong Chen, Sherman Oaks, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 99 days.

(21) Appl. No.: 10/817,698

(22) Filed: Apr. 2, 2004

(51) Int. Cl.
 *H01L 29/06* (2006.01)
(52) U.S. Cl. .................. 257/9; 257/E51.23; 257/E51.4; 716/5; 716/12; 716/15; 708/1; 708/441; 708/520
(58) Field of Classification Search ...................... None
 See application file for complete search history.

(56) References Cited

U.S. PATENT DOCUMENTS 6,900,479 B1 * 5/2005 DeHon et al. ............... 257/202
6,963,077 B1 * 11/2005 DeHon et al. .................. 257/9

\* cited by examiner

*Primary Examiner*—Dung A. Le

(57) ABSTRACT

A nanoscale or partial nanoscale interface within an electronic device, and a method for producing such interfaces without the need for precise nanoscale alignment of nanoscale elements of a first circuit layer to elements of a second circuit layer, is disclosed. In one embodiment, dimensions of conductive windows fabricated on microelectronic elements are carefully specified, and redundant nanoscale elements are introduced, in order to produce functional nanoscale-to-microscale interfaces despite imprecise nanoscale alignment of nanoscale elements to microscale elements.

4 Claims, 17 Drawing Sheets

US 7,049,626 B1

MISALIGNMENT-TOLERANT ELECTRONIC INTERFACES AND METHODS FOR PRODUCING MISALIGNMENT-TOLERANT ELECTRONIC INTERFACES

TECHNICAL FIELD

The present invention is related to interfaces between a first level of nanoelectronic circuitry and either a second level of nanoelectronic circuitry or to a layer of sub-microscale or microscale circuitry and, in particular, to nanoscale multiplexers, demultiplexers, and similar electronic devices and methods for producing interfaces between one layer of nanoscale circuitry and another layer of circuitry that are tolerant to displacements of the nanoscale circuitry layer with respect to the other layer of circuitry.

BACKGROUND OF THE INVENTION

Significant research and development efforts are currently being applied to the development of nanoscale electronic circuitry for use in computers, computer memories, and other electronic and microelectronic devices. Research is currently being undertaken to economically and reliably produce nanoscale devices based on nanowires and nanowire crossbars with different types of molecular junctions that provide different types of electrical functionalities analogous to well-known microscale and macroscale electronics components, including resistive molecular junctions, diode-like molecular junctions, switch molecular junctions, and other components analogous to standard electronics components. Nanowire-based and nanowire-crossbar-based electronics are extremely attractive for computer manufacturers and other electronic device manufacturers, because they provide higher-density circuitry without the extremely expensive approach of scaling photolithographic methods down to nanoscale dimensions. Nanoscale electronics have additional advantages, including relatively low power consumption and low operating voltages.

A number of useful nanoscale electronic circuits have been developed, and working nanoscale electronic devices are currently being prototyped. In such devices, layers of nanoelectronic circuitry need to interface with one another and with layers of traditional microelectronic circuitry by which discrete components are interconnected. A great challenge in building and manufacturing interfaces between nanoscale circuits and other circuits, including other nanoscale circuits, other sub-microscale circuits, and other microscale circuits involves alignment of nanoscale circuits to each other and to other types of circuits. Designers, developers, and manufacturers of nanoelectronic-circuit-containing devices have recognized that alignment of nanoscale elements may be an intrinsically difficult problem, and have recognized the need for manufacturing techniques and device designs that at least partially circumvent and/or address these alignment problems.

SUMMARY OF THE INVENTION

In various embodiments of the present invention, nanoscale-to-microscale interfaces within electronic devices are produced without the need for precise nanoscale alignment of nanoscale elements to microscale elements of the nanoscale-to-microscale interface. In these embodiments, dimensions of conductive windows fabricated on microelectronic elements are carefully specified, and redundant nanoscale elements are introduced, in order to produce functional nanoscale-to-microscale interfaces despite imprecise alignment of nanoscale elements with respect to microscale elements. The same design and manufacturing principles may be employed to produce alignment-tolerant nanoscale-to-nanoscale, nanoscale-to-submicroscale, and nanoscale-to-microscale circuit interfaces.

A method for fabricating a nanoscale-circuit-containing interface that represents one embodiment of the present invention is used to interconnect a first set of parallel, addressed nanowires with an approximately orthogonal second set of parallel microscale, sub-microscale, or nanoscale address-signal lines. First, the second set of address-signal lines is fabricated as original, complementary address-signal-line pairs, each complementary address signal line pair representing a single address bit. Then, active regions on the address signal lines are created such that gaps between adjacent active regions on two address-signal lines of a complementary address-signal-line pair are greater than a width of an addressed nanowire and less than a sum of a width of an addressed nanowire and an interspacing between adjacent addressed nanowires. Finally, the first set of nanowires is fabricated for control by the address-signal lines through the active regions. The method may be used to produce a nanoscale-circuit-containing interface with a set of parallel, original, complementary address-signal-line pairs, each complementary address signal line pair representing a single address bit, that control a set of parallel nanowires approximately orthogonally oriented to the set of parallel, original, complementary address-signal-line pairs.

DETAILED DESCRIPTION OF THE INVENTION

Nanoscale circuit interfaces may occur at many different places within an electronic device, such as within a computer processor or memory. The present invention is discussed, below, in the context of a multiplexer-like or demultiplexer-like component featuring microscale address-signal lines that interface to individually addressable nanowires. However, the present invention may be applied to a variety of nanoscale-to-microscale interfaces, nanoscale-to-submicroscale interfaces, and nanoscale-to-nanoscale interfaces in addition to multiplexers and demultiplexers.

Figure 1:
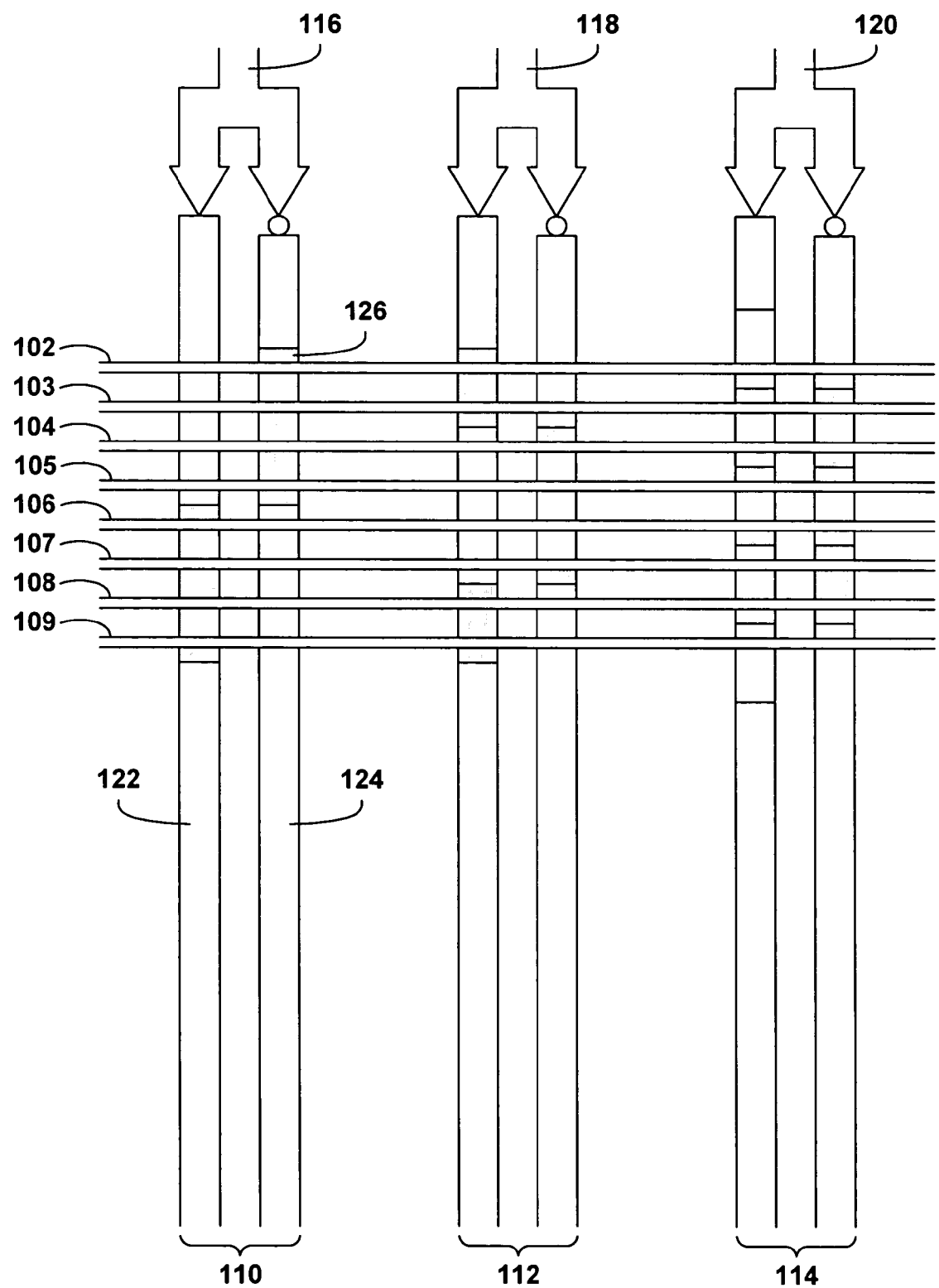
FIG. 1 shows a simple, exemplary nanoscale-to-microscale interconnection interface.

FIG. 1 shows a simple, exemplary nanoscale-to-microscale interconnection interface. In FIG. 1, eight horizontal nanowires 102–109 interface to three pairs of complementary address-signal lines 110, 112, and 114. In the exemplary interface shown in FIG. 1, a three-bit address may be input to three incoming address-signal lines 116, 118, and 120 in order to uniquely select one of the eight horizontal nanowires 102–109. Each input address signal is split to form a complementary pair of address-signal lines, so that when an ON, or "1," signal is input, for example, to input address line 116, the left-hand, pass-through address-signal line 122 of the complementary pair of signal lines 110 will have an ON, or "1," state, while the right-hand address-signal line 124 of the complementary pair of signal lines 110 will have the inverted OFF, or "0," state. One of two different conventions may be employed. A high-voltage or high-current state may be chosen to represent the binary value "1," or ON, and a low-voltage or low-current state may be chosen to represent the binary state "0," or OFF, in one convention, while in the opposite convention, a high-voltage or high-current state may be chosen to represent the binary state "0," or OFF, while a low-voltage or low-current state may be chosen to represent the binary state "1," or ON.

In the exemplary device shown in FIG. 1, a nanowire is interconnected with one address-signal line of each complementary pair of address-signal lines. Interconnections may be fashioned in a number of different ways. In the exemplary device, an exterior, insulator layer of the microscale address-signal line may be removed to expose a conductive underlayer, or the insulator surface of the microscale address-signal line may be physically transformed to a conductive state, in order to produce an exposed, local region of conductivity, or conductive window, each conductive window represented in FIG. 1 by a shaded portion of the address-signal lines, such as shaded portion 126 of address-signal line 124. Thus, nanowires 102–105 are electrically interconnected with address-signal line 124 via conductive windows at their respective points of overlap, but are not electrically connected with the complementary address-signal line 122 of the pair of address-signal lines, which lacks conductive windows at their respective points of overlap.

The molecular junctions at the points of overlap between the nanowires and microscale address-signal lines, or microwires, may vary in electrical properties. Molecular junctions can be fabricated to act as conductive connections, resistors, diodes, or transistors, among others. When a molecular junction is fabricated with conductive connection, resistor, or diode properties, current passes between the microwire and nanowire. However, when the molecular junction is fabricated with transistor properties, voltage applied to the microwire may serve to switch, or gate, the flow of current within the nanowire, allowing current to flow, in one microware voltage state, and preventing current flow, in the opposite microwire voltage state. When a conductive connection, resistor, or diode molecular junction fails to be properly fabricated, the conductive connection, resistor, or diode junction may become either a short or may be non-conductive under all microwire voltage conditions. Failed transistor-like molecular junctions, by contrast, may permanently place a nanowire into either a non-conductive or conductive state.

Figure 2:
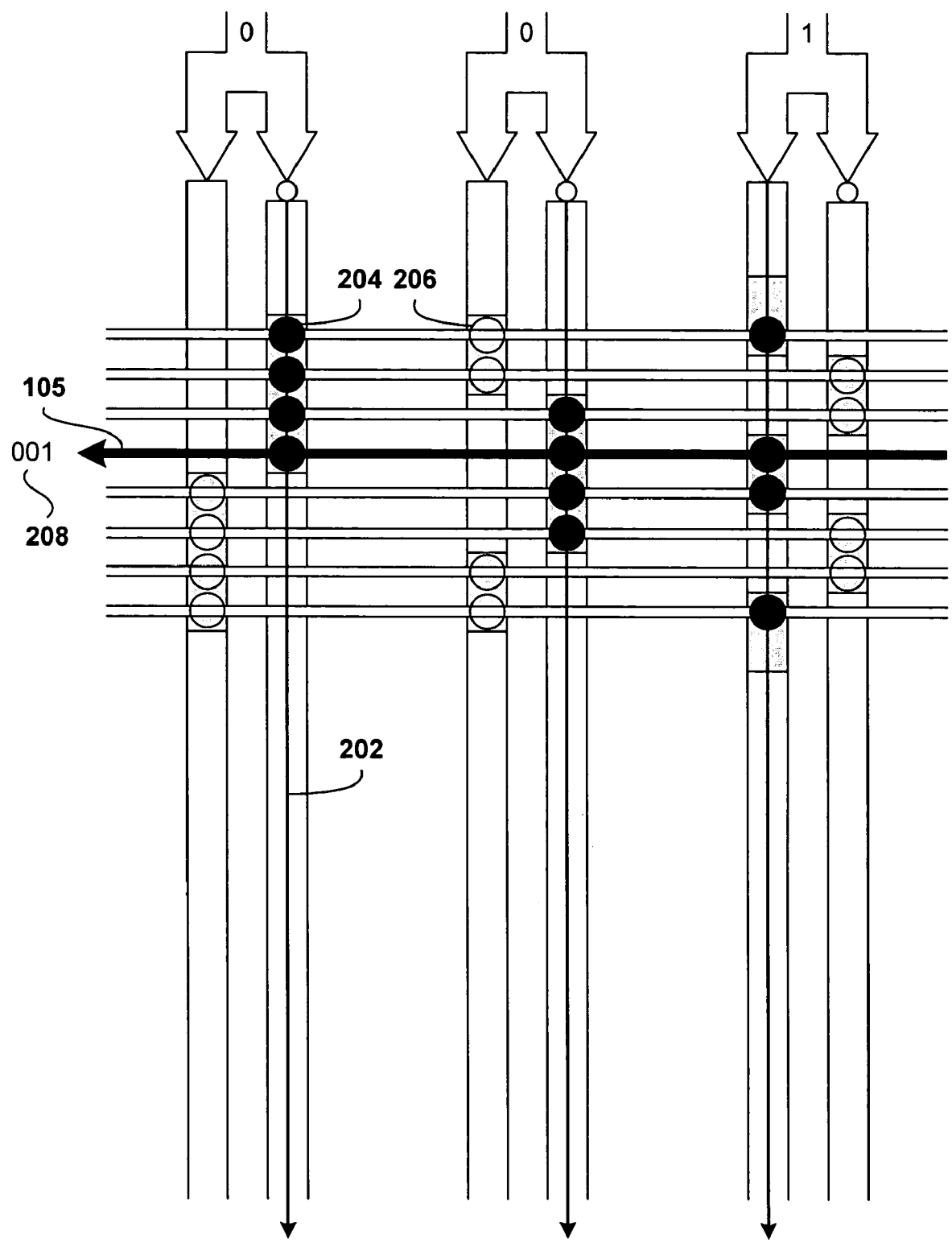
FIG. 2 illustrates addressing of a single nanowire within the exemplary nanoscale-to-microscale interconnection interface shown in FIG. 1.

FIG. 2 illustrates addressing of a single nanowire within the exemplary nanoscale-to-microscale interconnection interface shown in FIG. 1. In FIG. 2, and in subsequent figures, an address-signal line having a "1," or ON state, is shown with a centered, lengthwise arrow, such as centered, lengthwise arrow 202. Junctions between a nanowire and an address-signal line in a "1," or ON, state are indicated by filled circles, such as filled circle 204, and junctions between a nanowire and an address-signal line in the OFF, or "0," state are indicated by unfilled circles, such as unfilled circle 206. In the exemplary interface shown in FIG. 2, and in subsequent figures, a selected nanowire is a nanowire having three junctions all with address-signal line components in the ON, or "1," state, or, in other words, three active junctions. Since, in the exemplary interface shown in FIG. 2, each nanowire has three junctions with individual address-signal-line components or three address-signal-line complementary pairs, a selected nanowire is a nanowire with all three junctions active. In the transistor-like junction case, three active junctions, and no interactive junctions, results in the selected nanowire being able to pass current. Non-selected nanowires have at least one inactive junction, resulting in the nanowire's inability to carry current.

Figure 3:
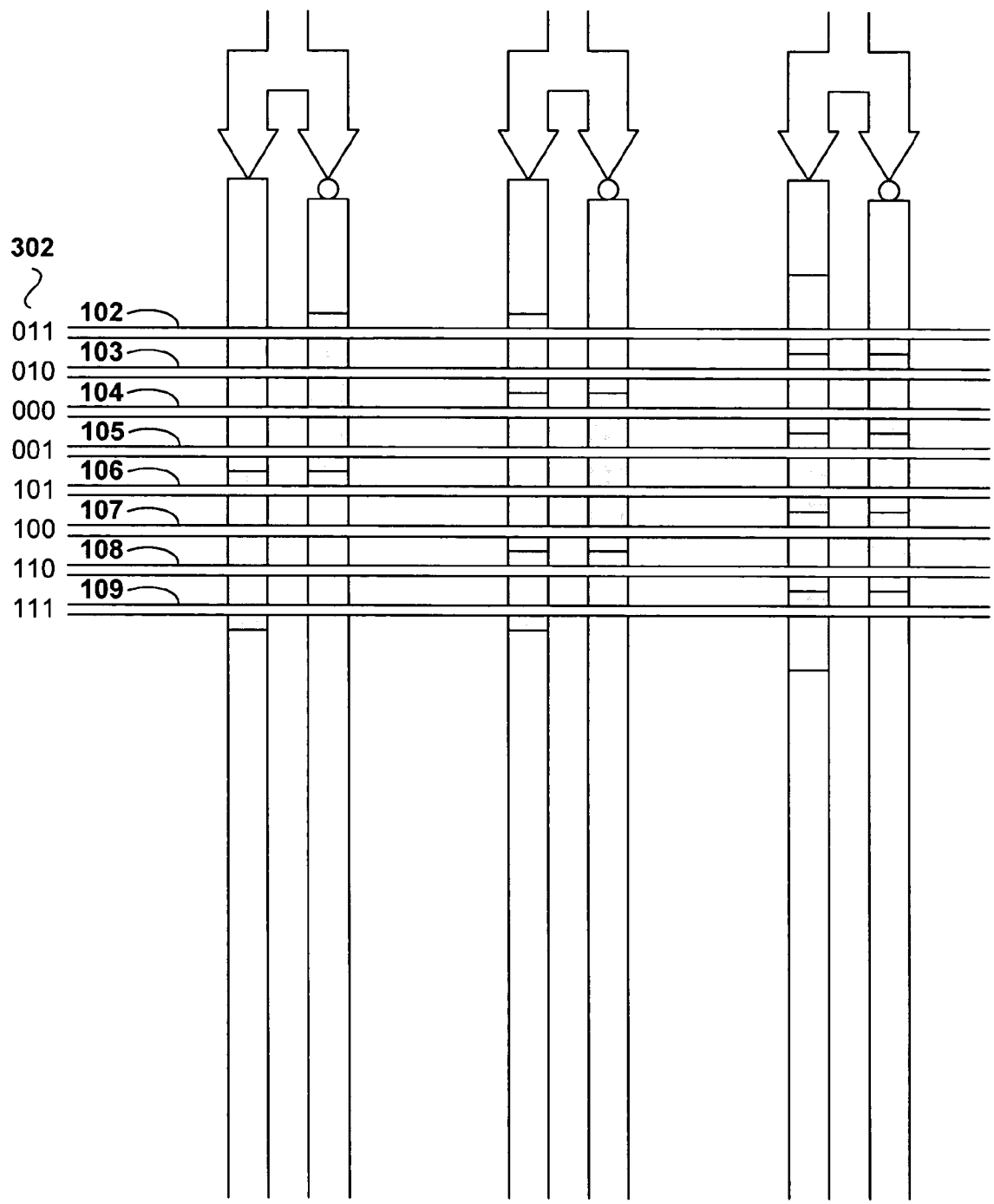
FIG. 3 shows the exemplary interface shown in FIGS. 1–2 with unique three-bit addresses, shown in column 302, assigned to each nanowire 102–109.

In FIG. 2, the input address "001" uniquely selects nanowire 105, indicated in FIG. 2 by shading of nanowire 105. Thus, nanowire 105 may be assigned the unique address "001" 208. By choosing each different possible input address, and determining the nanowire uniquely selected by the input address, each nanowire may be assigned a unique three-bit address. FIG. 3 shows the exemplary interface of FIGS. 1–2 with the nanowires labeled with unique, three-bit addresses. In FIG. 3, column 302 contains the unique, three-bit address corresponding to each nanowire 102–109.

Figure 4:
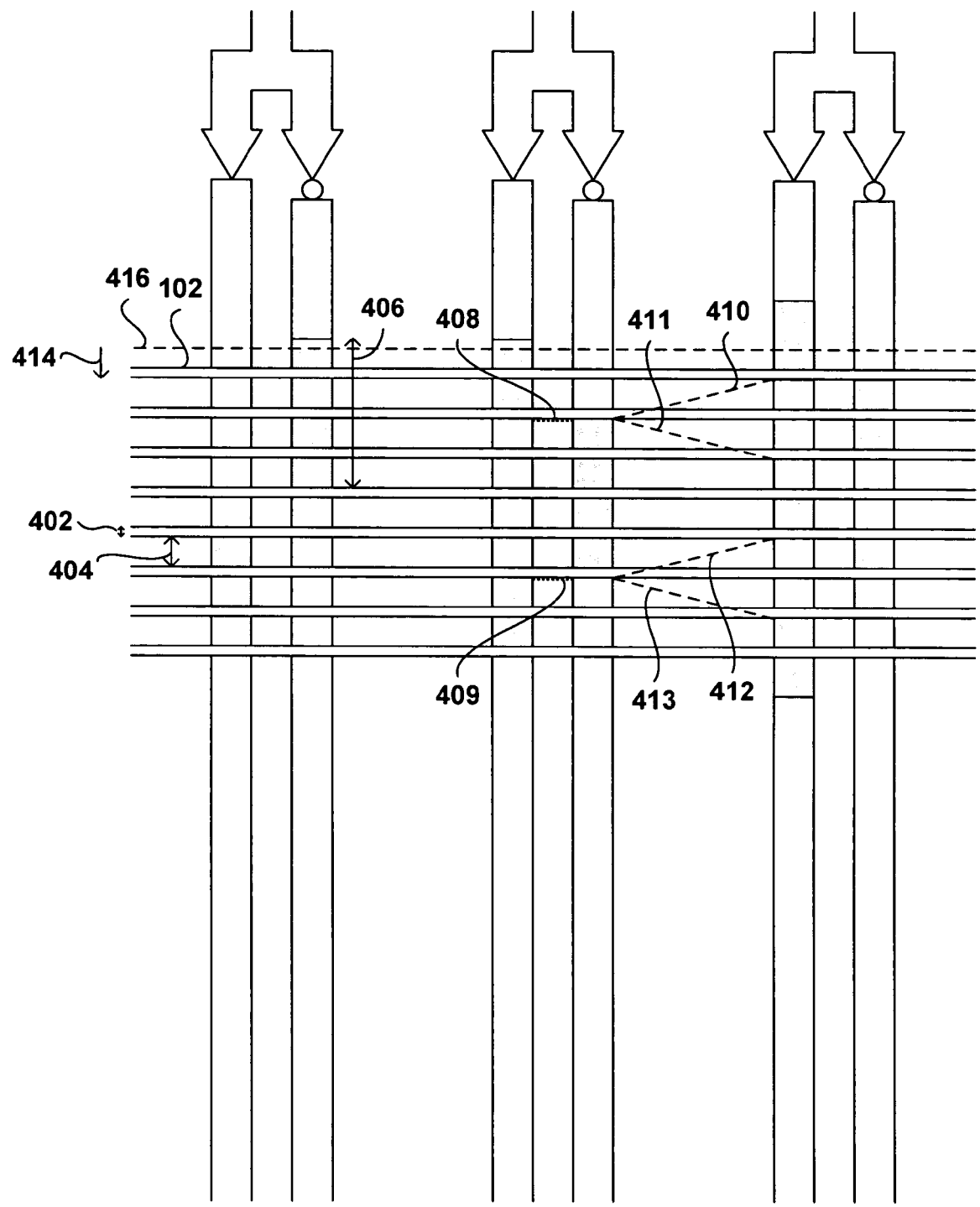
FIG. 4 illustrates the tolerances obtainable by currently available techniques for manufacture of nanoscale-to-microscale interconnection interfaces.

Nanoscale-to-microscale interconnection interfaces, such as the exemplary interface shown in FIGS. 1–3, can be fabricated by currently available techniques. Currently available techniques allow for controlling tolerances in many dimensions of the interconnection interface. FIG. 4 illustrates the tolerances obtainable by currently available techniques for manufacture of nanoscale-to-microscale interconnection interfaces. First, nanowires may be fabricated with well-controlled widths 402. In addition, sets of parallel nanowires may be fabricated with well-controlled interspacings 404. Thus, the set of nanowires in the exemplary interconnection interface may be manufactured so that the widths of all of the nanowires fall within a relatively narrow range of widths, and so that the interspacing between each nanowire and each of its neighbors also falls within a relatively narrow range of distances. The conductive windows on the microscale address-signal lines may be manufactured with well-controlled lengths 406, and the relative offsets, or displacements, of windows on each microscale address-signal line with respect to adjacent windows on the other microscale address-signal lines can also be relatively precisely controlled 408–413. However, the relative positions of the nanowires with respect to the length dimension of the microscale address-signal lines cannot be precisely controlled. Thus, for example, the positions of the nanowires in FIG. 4 are shown displaced by a downward, vertical displacement 414 with respect to the positions of the nanowires shown in FIGS. 2–3. In other words, for example, nanowire 102 has been displaced from its position 416 in FIGS. 2–3 by the downward, vertical displacement 414. Such displacements are referred to, below, as misalignments.

Figure 5:
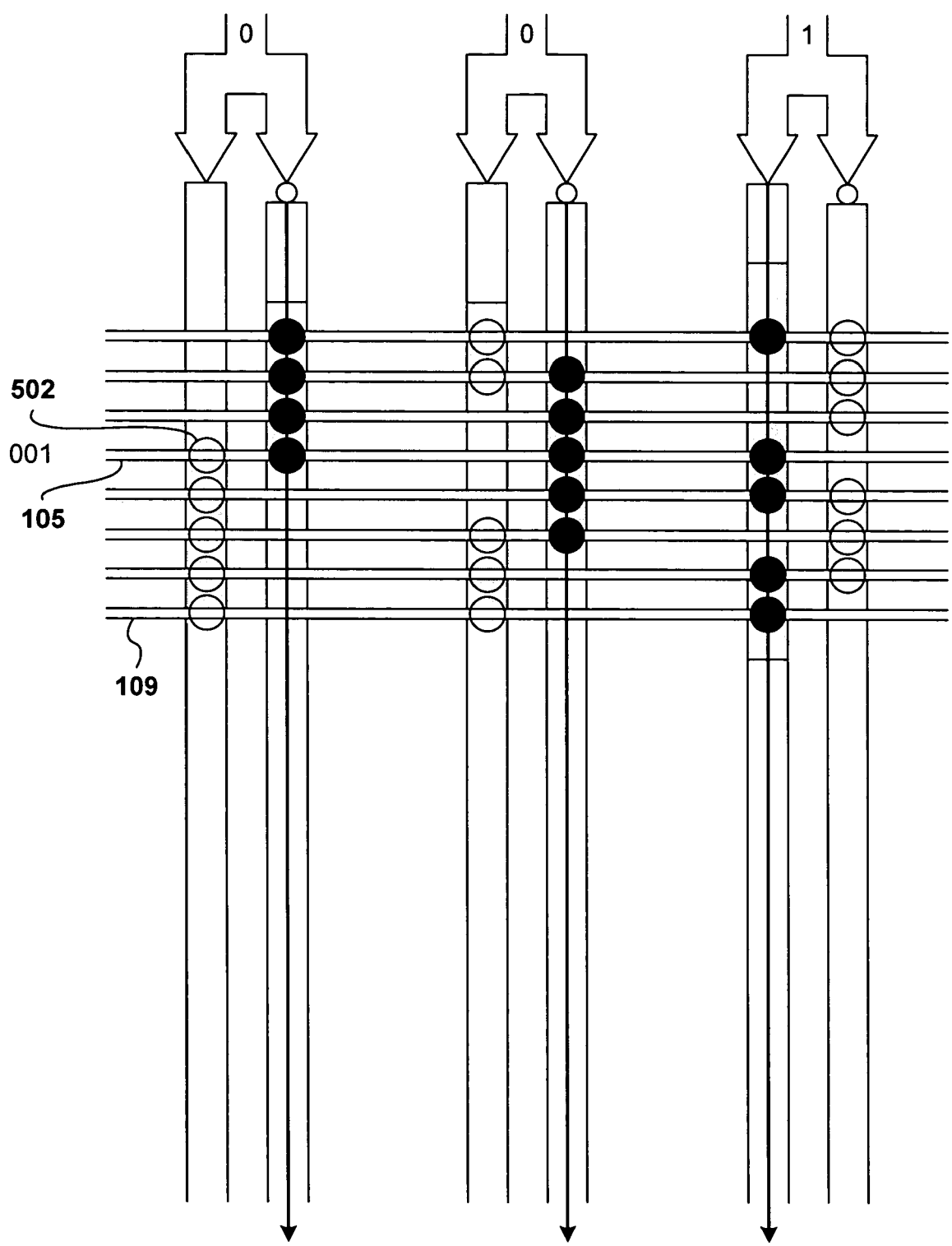
FIGS. 5–7 illustrate the implications of a nanowire-set displacement with respect to the microscale address-signal lines.
Figure 6:
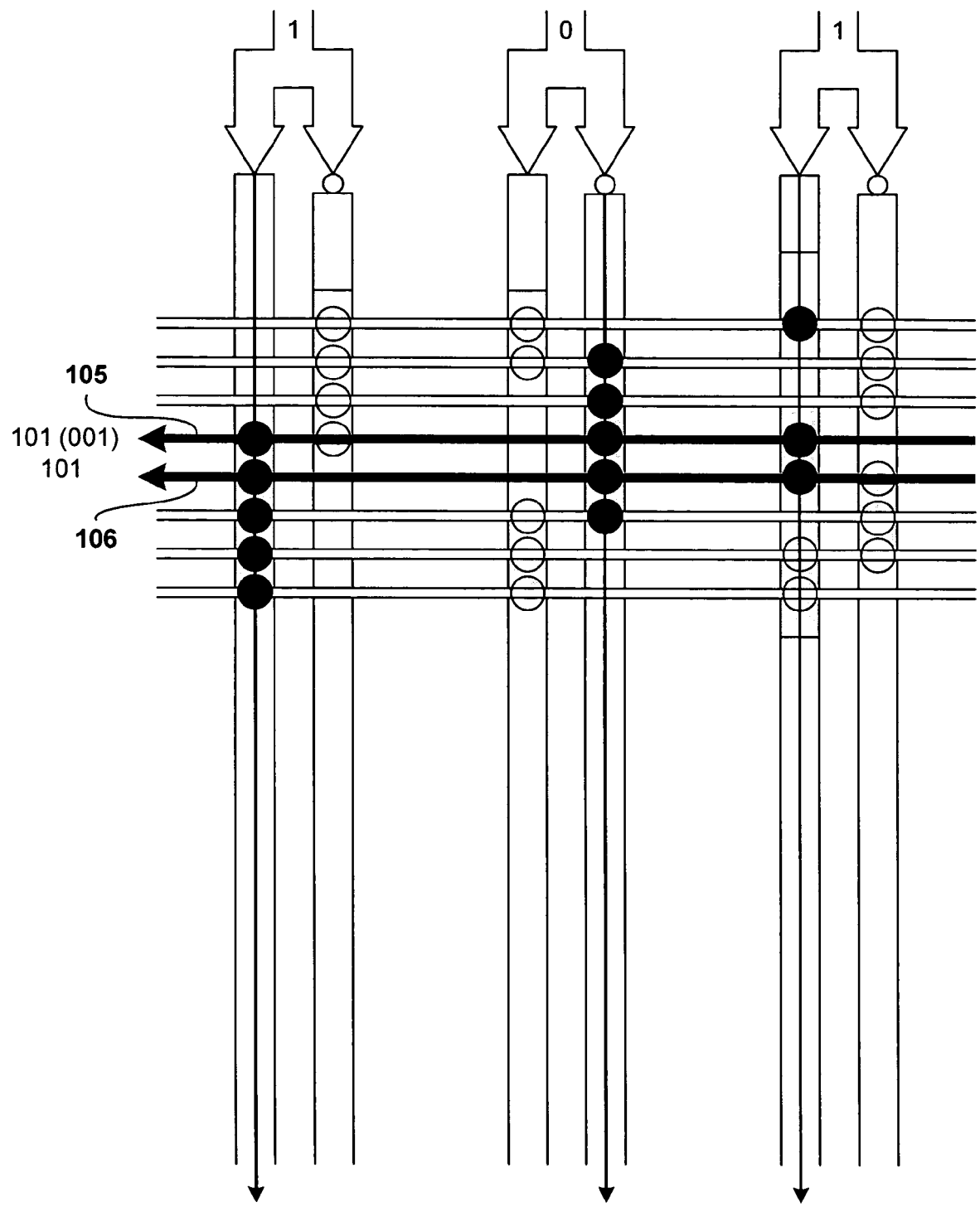
Figure 7:
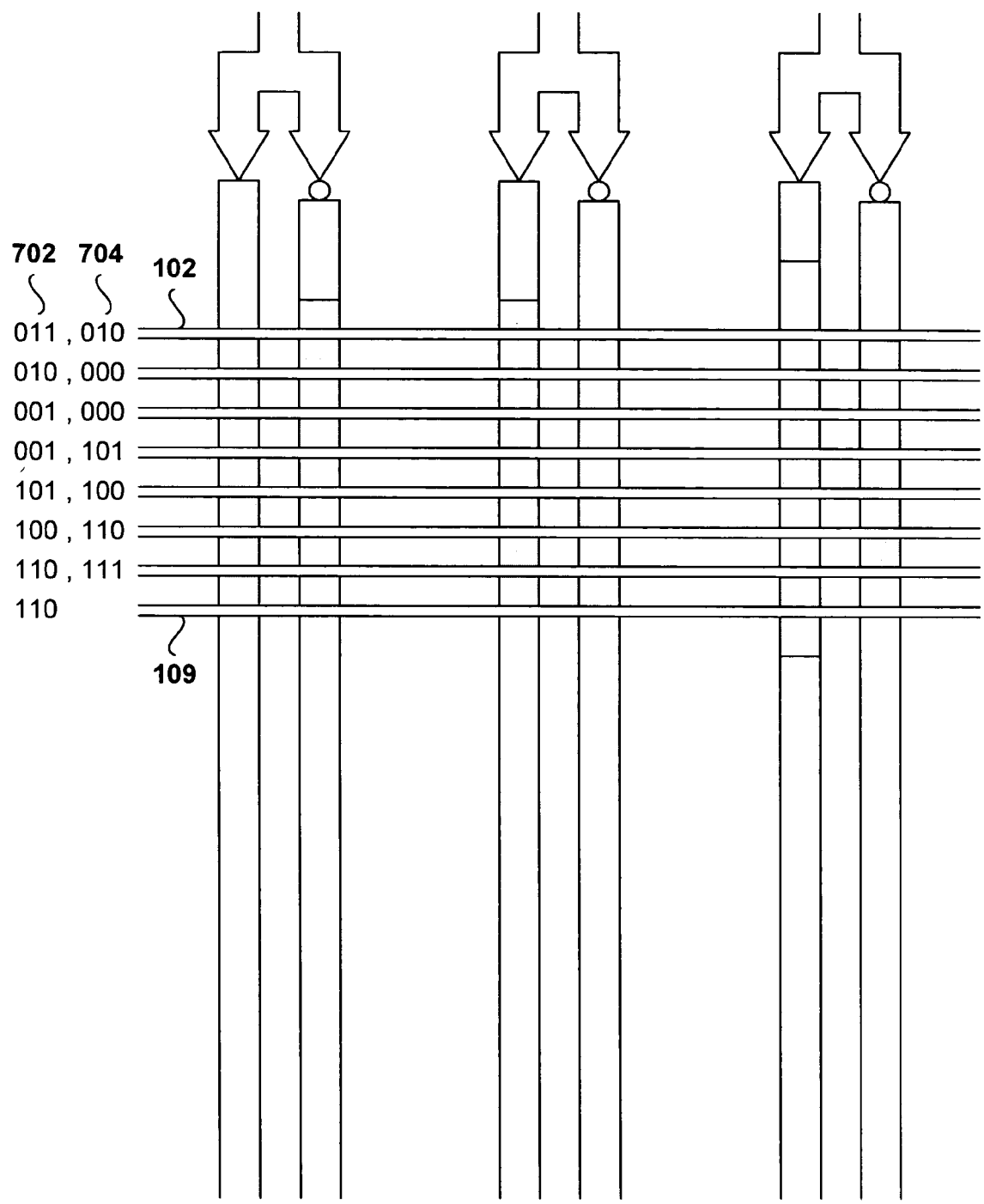

FIGS. 5–7 illustrate the implications of a nanowire-set displacement with respect to the microscale address-signal lines. In FIG. 5, the address "001" is input to the incoming address-signal lines, just as in FIG. 2. As in FIG. 2, the single nanowire 105 with address "001" is selected, assuming, again, that the presence of three active interconnections is the criterion for selection. However, due to the shift of the nanowires, there is an inactive interconnection 502 now present on nanowire 105 when the address "001" is input to the address-signal lines. Comparison of FIGS. 5 and 2 reveals that many additional inactive and active connections result from the nanowire-set displacement illustrated in FIG. 4. For example, in FIG. 5, all of the nanowires, except for nanowire 109, now have four interconnections with address-signal lines, rather than three, as in FIG. 2.

FIG. 6 shows the results of inputting address "101" into the input address-signal lines for the exemplary interconnection interface shown in FIGS. 4–5. Input of the address "101" results in selection of both nanowires 105 and 106. Thus, both nanowires 105 and 106 may be labeled with the address "101," and nanowire 105 may also be labeled with the address "001," as discussed above with reference to FIG. 5. In other words, as illustrated in FIGS. 5–6, neither nanowire 105 nor nanowire 106 is now uniquely addressable. FIG. 7 shows the addresses that may be assigned to the nanowires in the exemplary interconnection interface shown in FIGS. 5 and 6 by examining the nanowires selected for each possible 3-bit input address. For all but the last nanowire 109, each nanowire is selected by two three-bit addresses, shown in the columns 702 and 704 in FIG. 7. Thus, for example, the first nanowire 102 may be selected by inputting either address "011" or address "010." Thus, the small downward, vertical displacement of the set of nanowires in the interconnection interface shown in FIGS. 5–7 results in loss of unique addressability of all but the final nanowire.

Unfortunately, a demultiplexer component of an electrical device is generally useless unless each address input to the incoming address-signal lines results in selection of a single orthogonal nanowire signal line, in the best case, or at least a deterministic and predictable selection of a small, discrete, unique subset of the orthogonal signal lines. The interconnection interface illustrated in FIGS. 5–7 would be useful if the addressability shown in FIG. 7 were always obtained in manufactured interconnection interfaces. However, as shown by comparing FIG. 7 to FIG. 3, different addressability obtains when the relative position of the regularly interspaced nanowires is shifted vertically along the length dimension of the microscale address-signal lines. Because the alignment of the nanowires to specific positions along the length dimension of the microscale address-signal lines cannot be controlled to high position during the manufacturing process, the current approach, discussed with reference to FIGS. 1–7, cannot be used for economical manufacturer of nanoscale-to-microscale interconnection interfaces.

Figure 8:
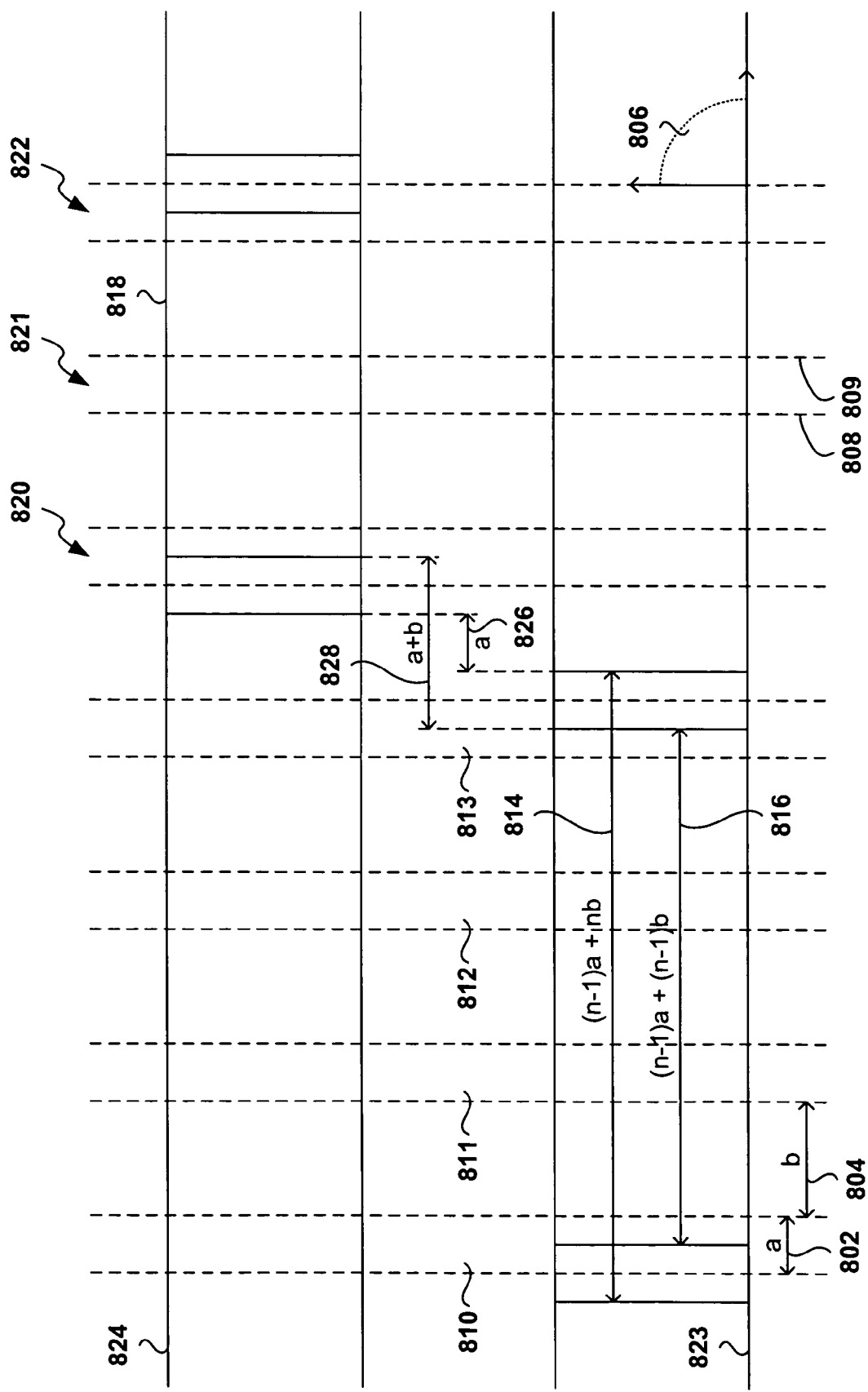
FIGS. 8–10 illustrate a method that represents one embodiment of the present invention.
Figure 9:
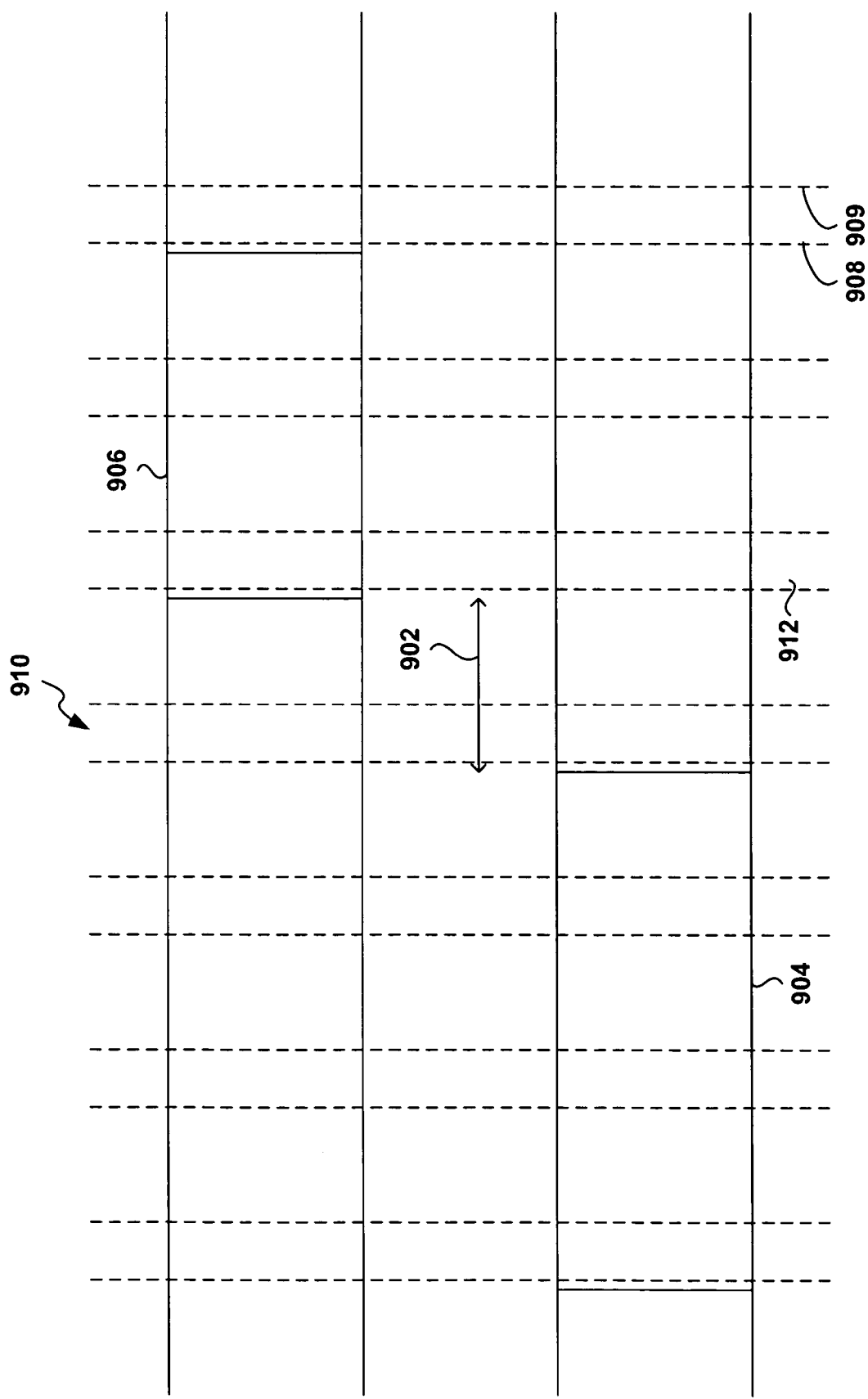
Figure 10:
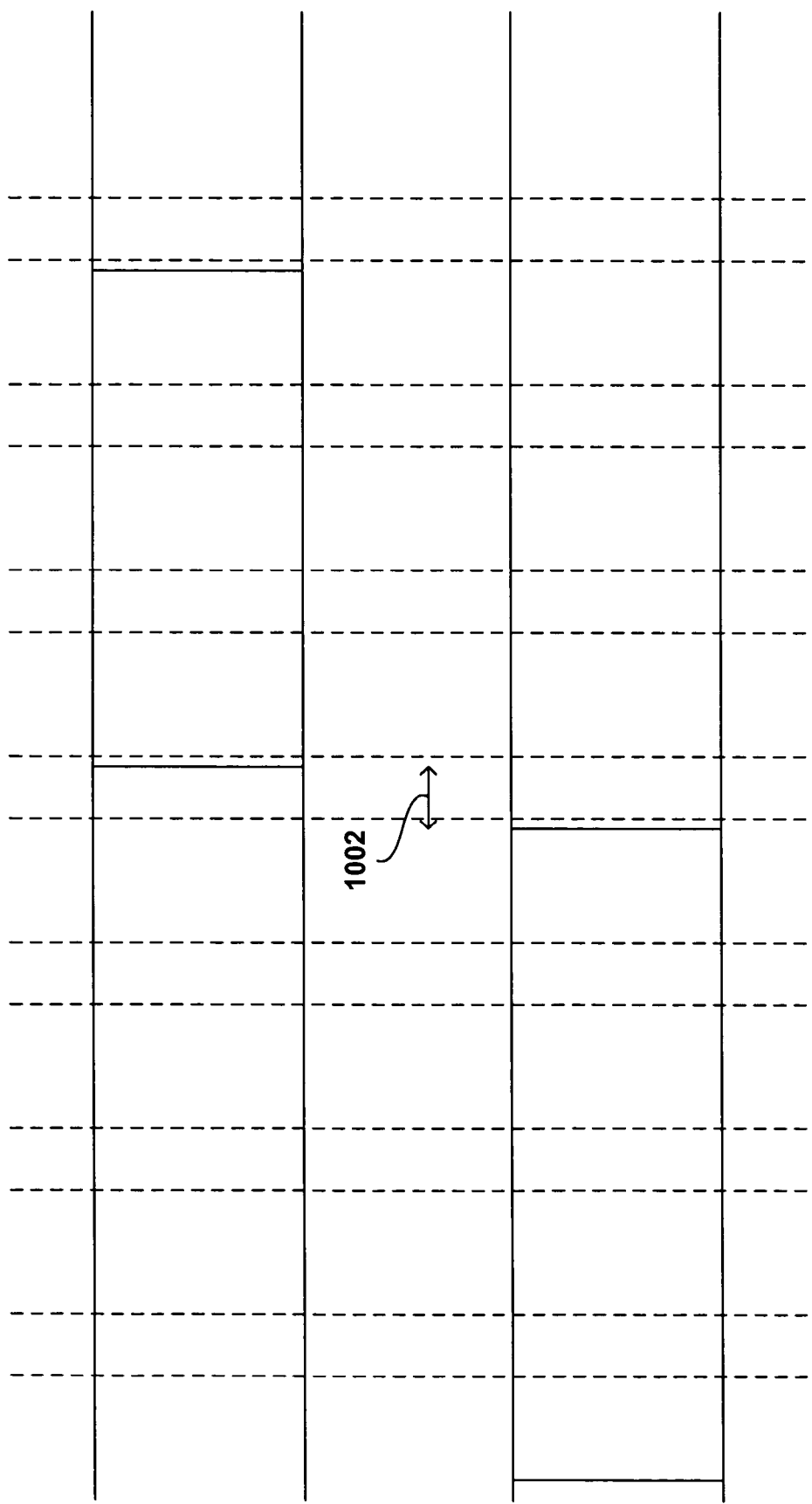

FIGS. 8–10 illustrate a method that represents one embodiment of the present invention. FIG. 8 shows conductive-window dimensions and positions relative to conductive windows on the other address-signal line of a complementary address-signal-line pair that together prevent a deleterious increase in the number of interconnections for nanowires when the nanowires are translated along the length dimension of address-signal lines. As discussed above, both the width 802 and interspacing 804 of nanowires may be relatively precisely controlled during the manufacturing process. Moreover, as shown in FIG. 8, the angle of the parallel nanowires 806 with respect to the address-signal lines can also be relatively precisely controlled to be 90 degrees, or any other chosen angle.

In order to prevent the deleterious increase in interconnections illustrated in FIGS. 2 and 5 resulting from a vertical displacement of a set of nanowires, the dimensions of the conductive windows fabricated on the microscale address-signal lines need to be carefully controlled. As discussed above, the conductive windows may be precisely positioned with respect to an assumed nanowire positioning. The assumed position for nanowires are shown in FIG. 8 by dashed lines, such as the pair of dashed lines 808–809 that represent the location of the second-most right-hand nanowire in a set of eight nanowires. The nanowire positions are assumed because, as discussed above, nanowires cannot be precisely positioned with respect to the length dimension of the microscale address-signal lines. However, assuming positions for the nanowires, conductive windows may be precisely fabricated on the address-signal lines relative to the assumed positions. In one embodiment of the present invention, a conductive window is determined, by the need for nanowire interconnections in order to provide a desired nanowire addressability, to need to span a predetermined number of nanowires n at a particular position on an address-signal line. For example, as shown in FIG. 8, a conductive window may be determined to need to span the first four assumed nanowire positions 810–813. In one embodiment of the present invention, the length of a conductive window needed to span n nanowires needs to be controlled to lie within the range of lengths provided by the following expression:

$$(n-1)a+(n-1)b<W_n<(n-1)a+nb$$

where
n=number of nanowires that need to be spanned,
a=width of a nanowire,
b=interspacing distance between nanowires, and
$W_n$=width of the conductive window for spanning n nanowires.

Referring to FIG. 8, the maximum-length, exclusive limit for the conductive window spanning nanowires 810–813, as calculated according to the above expression, is indicated by double-headed arrow 814, and the minimum-length, exclusive limit for the conductive window for spanning nanowires 810–813, as calculated according to the above expression, is indicated by double-headed arrow 816. Note that the conductive window is centered on the assumed positions of the four nanowires 810–813. The above expression is used, in FIG. 8, to specify the maximum and minimum conductive-window lengths for an adjacent conductive window 818 spanning three subsequent nanowires 820–822 on the opposite microscale address-signal line 824 of the complementary pair of address-signal lines 823–824. Using the specified conductive-window-length ranges, it can been seen, in FIG. 8, that the gap between adjacent conductive windows on the complementary address-signal-line pair 823–824 ranges between slightly greater than the width of a nanowire, a, 826 and the sum of the width of a nanowire and a single nanowire interspacing, a+b, 828.

FIG. 9 shows the two, adjacent conductive windows shown in FIG. 8, with minimal dimensions, when the nanowire positions are displaced from the assumed nanowire positions shown in FIG. 8. In other words, in FIG. 9, the gap 902 between the adjacent conductive windows 904 and 906 is maximally sized. In this case, when nanowires are positioned relative to the conductive windows, as indicated in FIG. 9 by the dashed-line nanowire-position indications, such as the nanowire position indication represented by dashed lines 908–909, causing a particular nanowire 910 to be positioned just within the gap between adjacent conductive windows, the neighboring nanowire 912 is fully spanned by conductive window 906. Thus, when the minimally sized conductive windows are employed, thereby resulting in maximally sized gaps between adjacent conductive windows on complementary address-signal lines, only a single nanowire may reside in any given gap between adjacent conductive windows. Conversely, as shown in FIG. 10, when maximally sized conductive windows are employed, no single nanowire can reside within a gap between adjacent conductive windows on complementary address-signal lines. However, no single nanowire can concurrently interconnect with two adjacent conductive windows, since the minimally sized gap 1002 is larger than the width of a nanowire.

Figure 11:
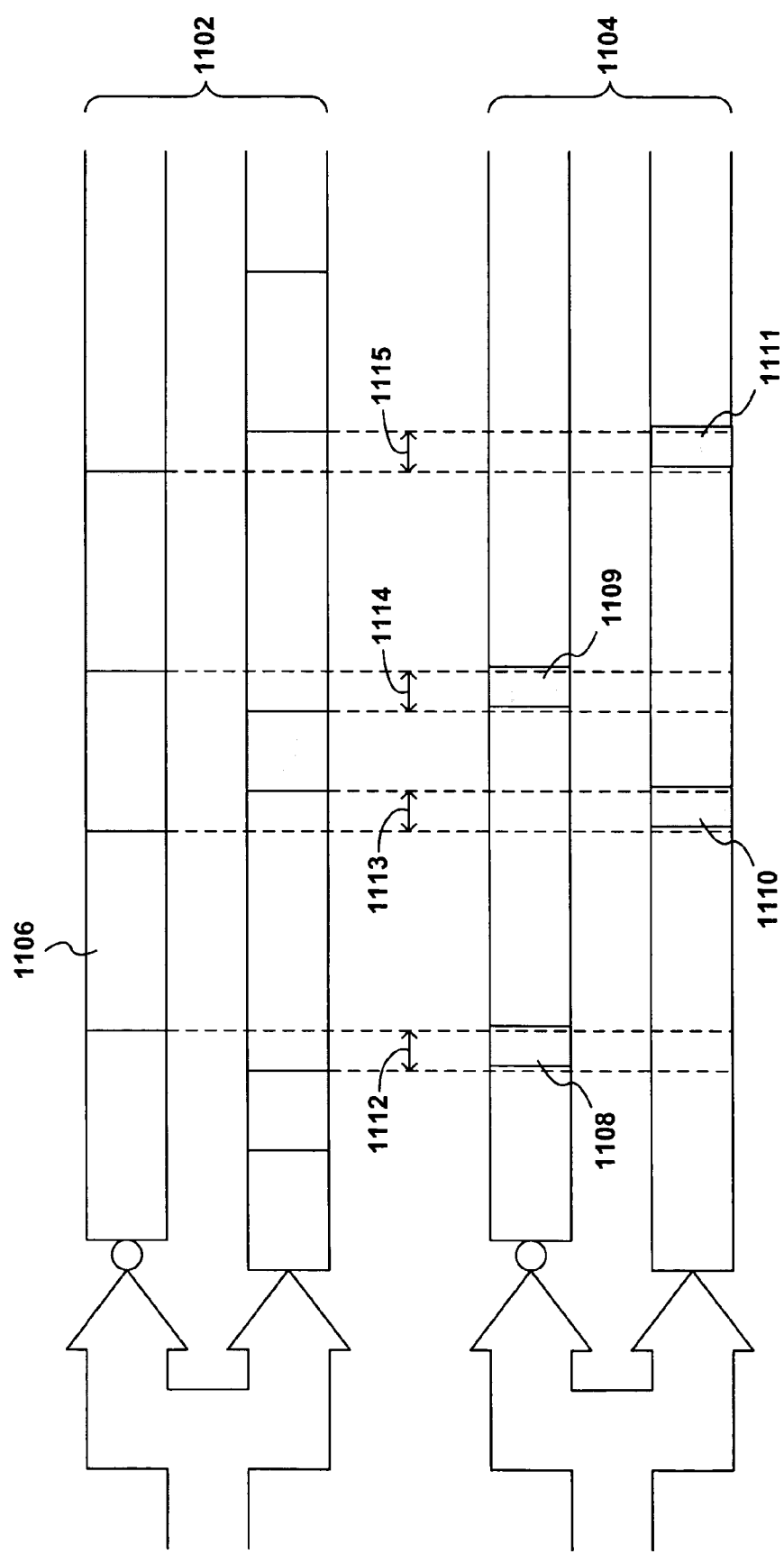
FIG. 11 shows conductive-window length and interspacings on a complementary address-signal-line pair and a supplemental, complementary address-signal-line pair according to one embodiment of the present invention.

The implications of the above-specified conductive-window length relative to the widths and interspacing distance of nanowires ensures that additional, deleterious interconnections, such as additional deleterious interconnection 502 shown in FIG. 5, may not arise when nanowires are displaced from their assumed positions relative to conductive windows. In other words, no nanowire can concurrently interconnect with adjacent conductive windows on complementary address-signal lines. However, as mentioned above, it is possible, when less than maximally sized conductive windows are used, for a nanowire to fall within a gap between adjacent conductive windows, and therefore completely avoid interconnecting with a complementary address-signal-line pair. To remedy the possibility of gap-residing nanowires with respect to a complementary address-signal-line pair, a second aspect of the present invention is to provide a second, supplemental complementary address-signal-line pair for each complementary address-signal-line pair needed to implement one bit of a multi-bit address space, member addresses of which are input to a nanoscale-to-microscale interconnection interface. In the additional complementary address-signal-line pair, the length of conductive windows must fall within a range specified by the following expression:

$$g-a<W_s<W_o$$

where
  g=gap between adjacent conductive windows,
  a=width of a nanowire,
  $W_s$=length of conductive window on supplemental address-signal-line pair, and
  $W_o$=length of corresponding conductive window on original address-signal-line pair FIG. 11 shows conductive-window lengths and interspacings on a complementary address-signal-line pair and a supplemental, complementary address-signal-line pair according to one embodiment of the present invention. In FIG. 11, an original, complementary address-signal-line pair 1102 is shown paired with a supplemental, complementary address-signal-line pair 1104. Conductive windows, such as conductive window 1106, are fabricated on the original complementary address-signal-line pair with dimensions and gaps within ranges specified by the first of the above-provided expressions, according to one embodiment of the present invention. Minimally sized, alternating, and original-address-signal-line-pair-gap-filling conductive windows 1108–1111 are fabricated on the supplemental, complementary address-signal-line pair 1104 in order to span the gaps 1112–1115 between the adjacent conductive windows fabricated on the original complementary address-signal-line pair 1102.

Regardless of the positioning of a covering set of parallel nanowires with respect to the conductive windows of the complementary address-signal-line pairs, shown in FIG. 11, full, unique addressability of nanowires obtains. Moreover, only two logical cases arise with the configuration and dimensions of conductive windows illustrated in FIG. 11.

Figure 12:
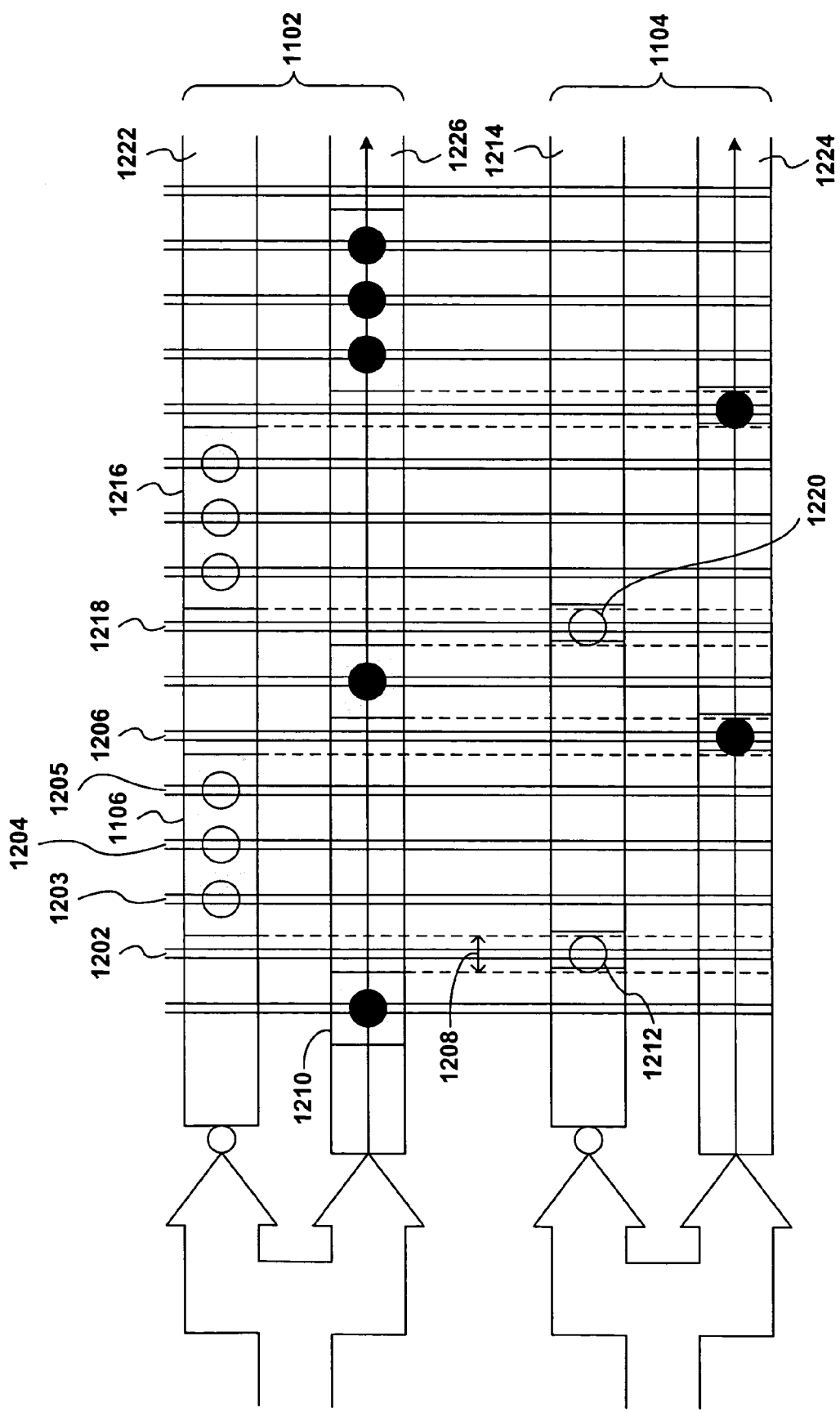
FIGS. 12–13 illustrate a first case arising from a positioning of a set of parallel nanowires with respect to the conductive windows shown in FIG. 11.
Figure 13:
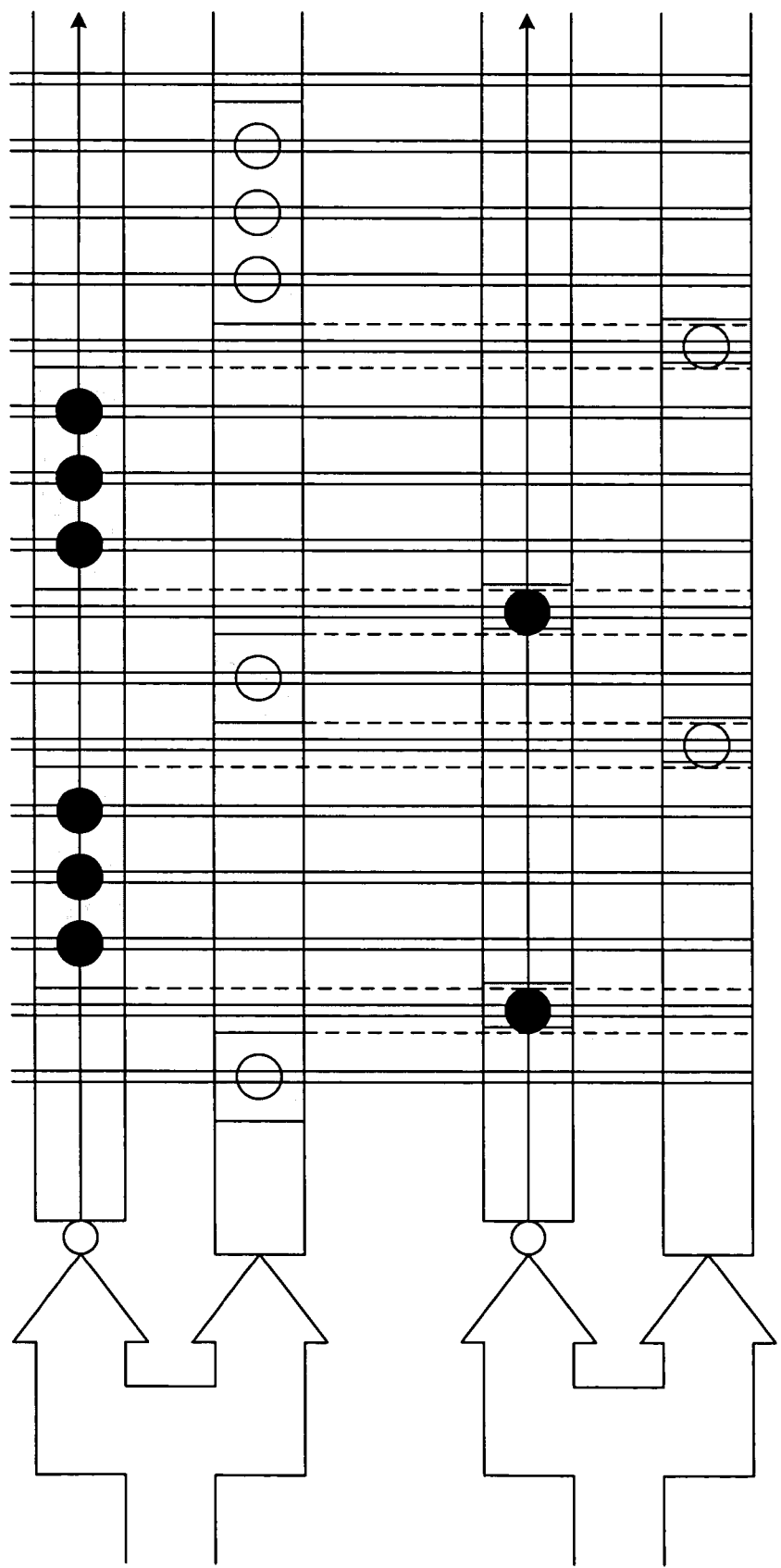

FIGS. 12–13 illustrate a first case arising from a positioning of a set of parallel nanowires with respect to the conductive windows shown in FIG. 11. In FIG. 12, the nanowires are misaligned with respect to the conductive windows of the original complementary address-signal-line pair 1102, resulting in the conductive windows spanning one less than a desired number of nanowires. Thus, for example, conductive window 1106 is dimensioned and positioned to span four nanowires, but, because of the positioning of the parallel set of nanowires, including nanowire 1202, with respect to the complementary pair of address-signal lines 1102, conductive window 1106 spans only the three nanowires 1204–1206. Nanowire 1203 can be seen to fall into the gap 1208 between conductive windows 1210 and 1106. However, the non-interconnected nanowire 1203 is interconnected 1212 with address-signal line 1214 of the supplemental address-signal-line pair 1104. Similarly, although conductive window 1216 fails to span the four nanowires, the unspanned nanowire 1218 is interconnected 1220 by the address-signal line 1214. Therefore, the pair of address-signal lines 1214 and 1222 can be used together in order to provide the interconnections originally intended for address-signal line 1222, and the pair of address-signal lines 1224 and 1226 can be used together to provide the interconnections intended for address-signal line 1226. FIG. 13 shows the same relative position of nanowires to address-signal lines as shown in FIG. 12, with opposite states of the address-signal lines.

Figure 14:
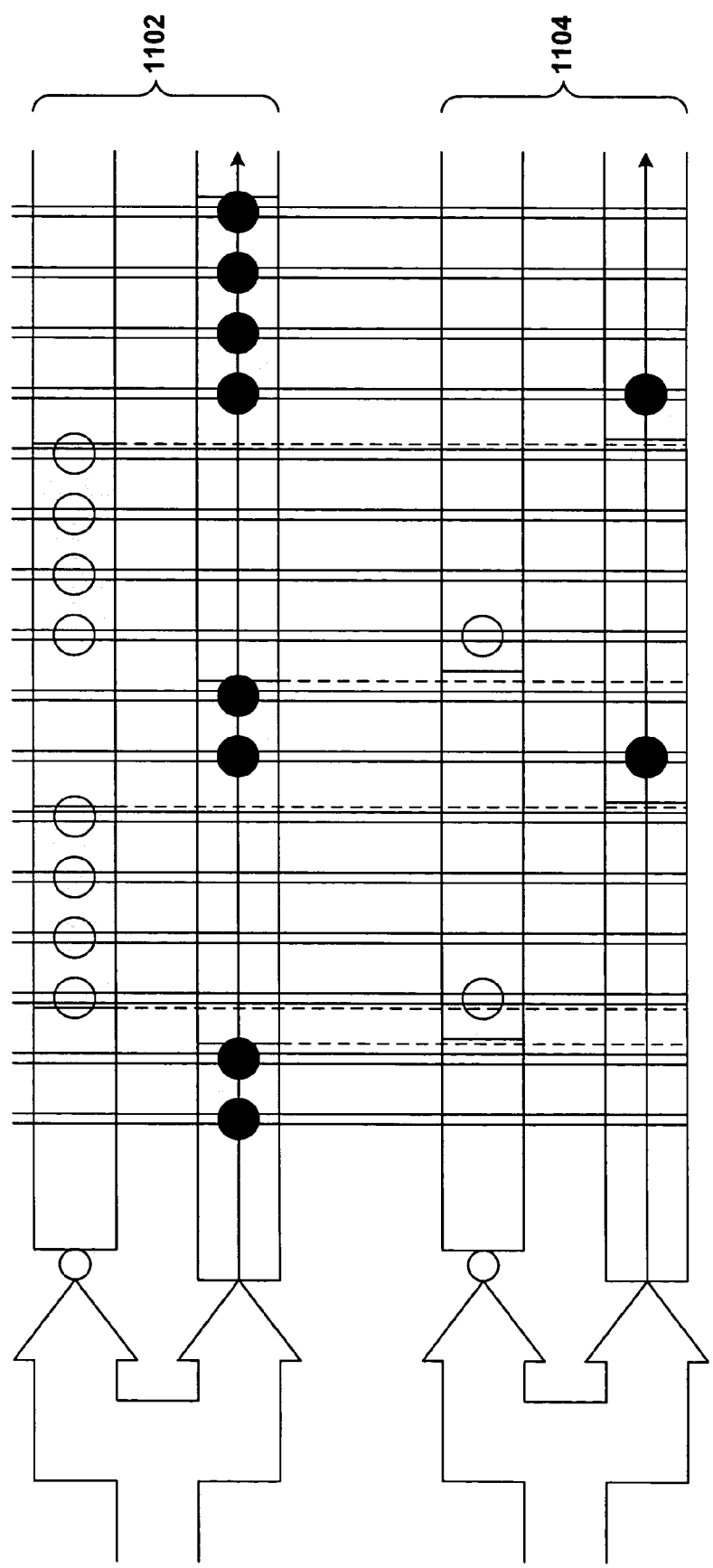
FIGS. 14–15 illustrate a second case arising from a positioning of a set of parallel nanowires with respect to the conductive window shown in FIG. 11.
Figure 15:
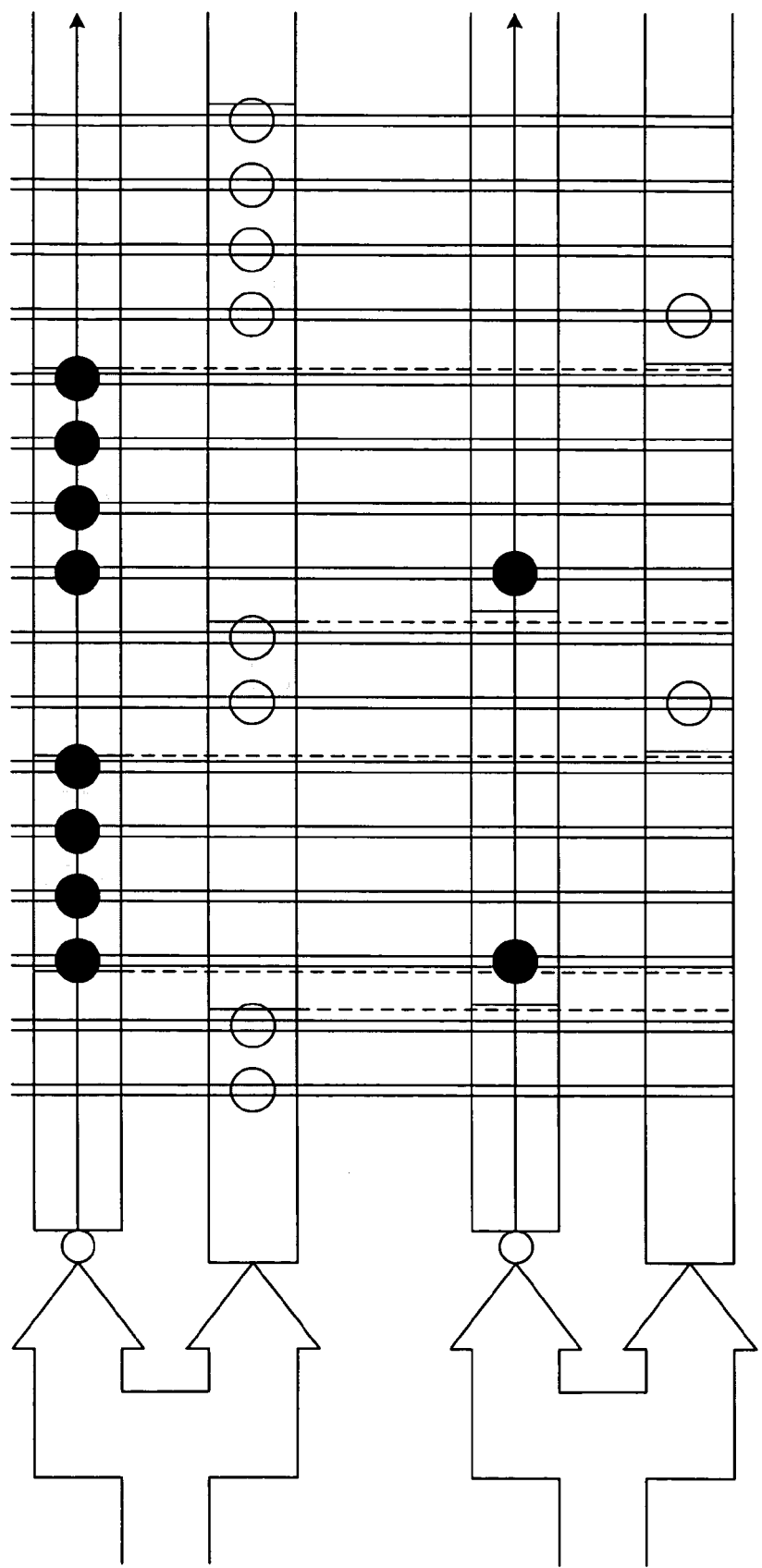

FIGS. 14–15 illustrate a second case arising from a positioning of a set of parallel nanowires with respect to the conductive window shown in FIG. 11. In FIGS. 14–15, the nanowires are correctly aligned with respect to the conductive windows, so that full and correct interconnection between nanowires and the original complementary address-signal-line pair 1102 is obtained. In this case, the supplemental address-signal-line pair is unneeded. Comparison of FIG. 12 to FIG. 14, and comparison of FIG. 13 to FIG. 15, reveals that when the supplemental address-signal-line pair is needed in the cases shown in FIGS. 12 and 13, the resulting interconnection topology and addressability using combined address-signal lines 1214/1222 and 1224/1226 produces the exact same interconnection topology and addressability as in the correctly aligned case shown in FIGS. 14–15.

Figure 16:
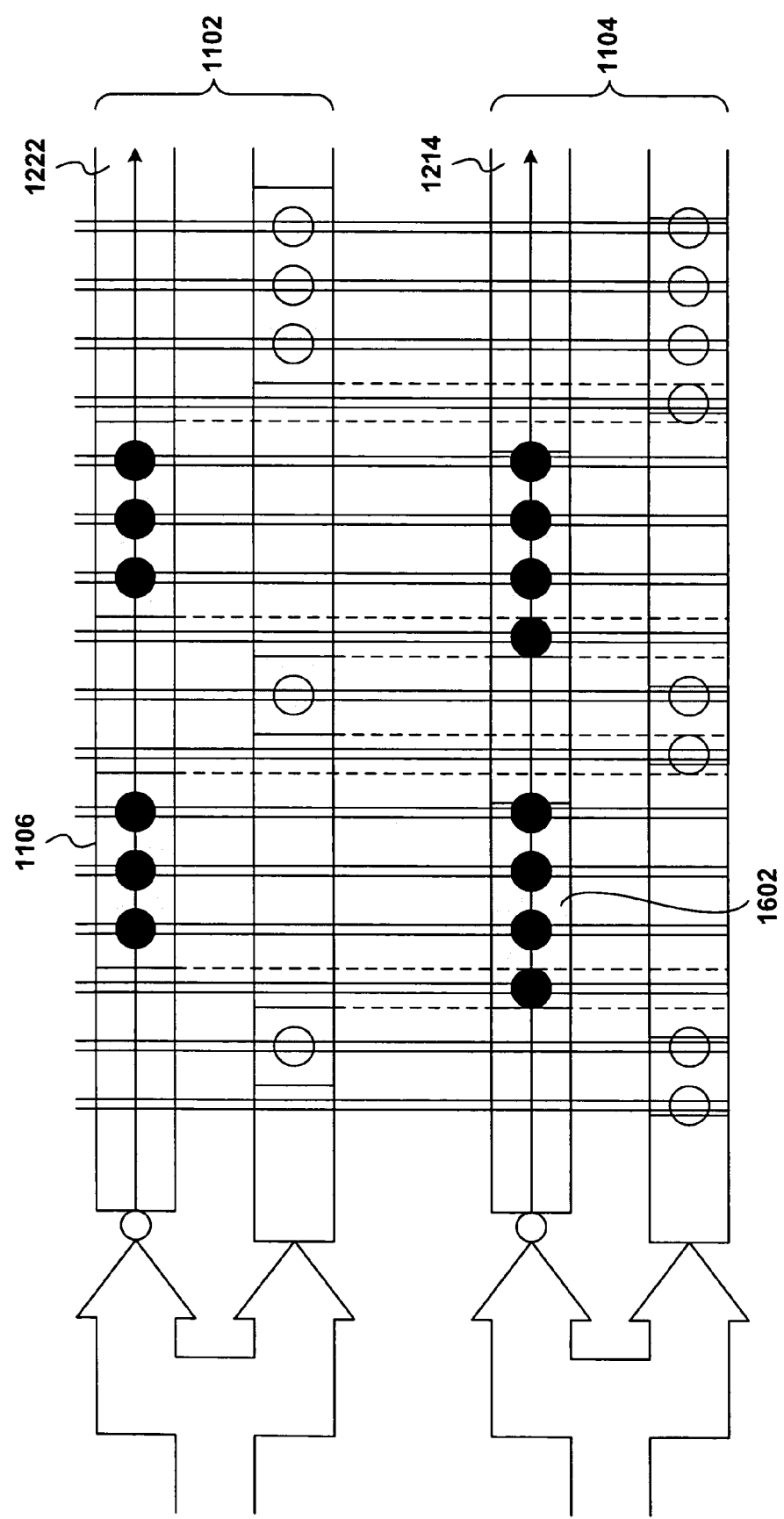
FIGS. 16–17 illustrate a third case arising from a positioning of a set of parallel nanowires with respect to the conductive windows shown in FIG. 11.
Figure 17:
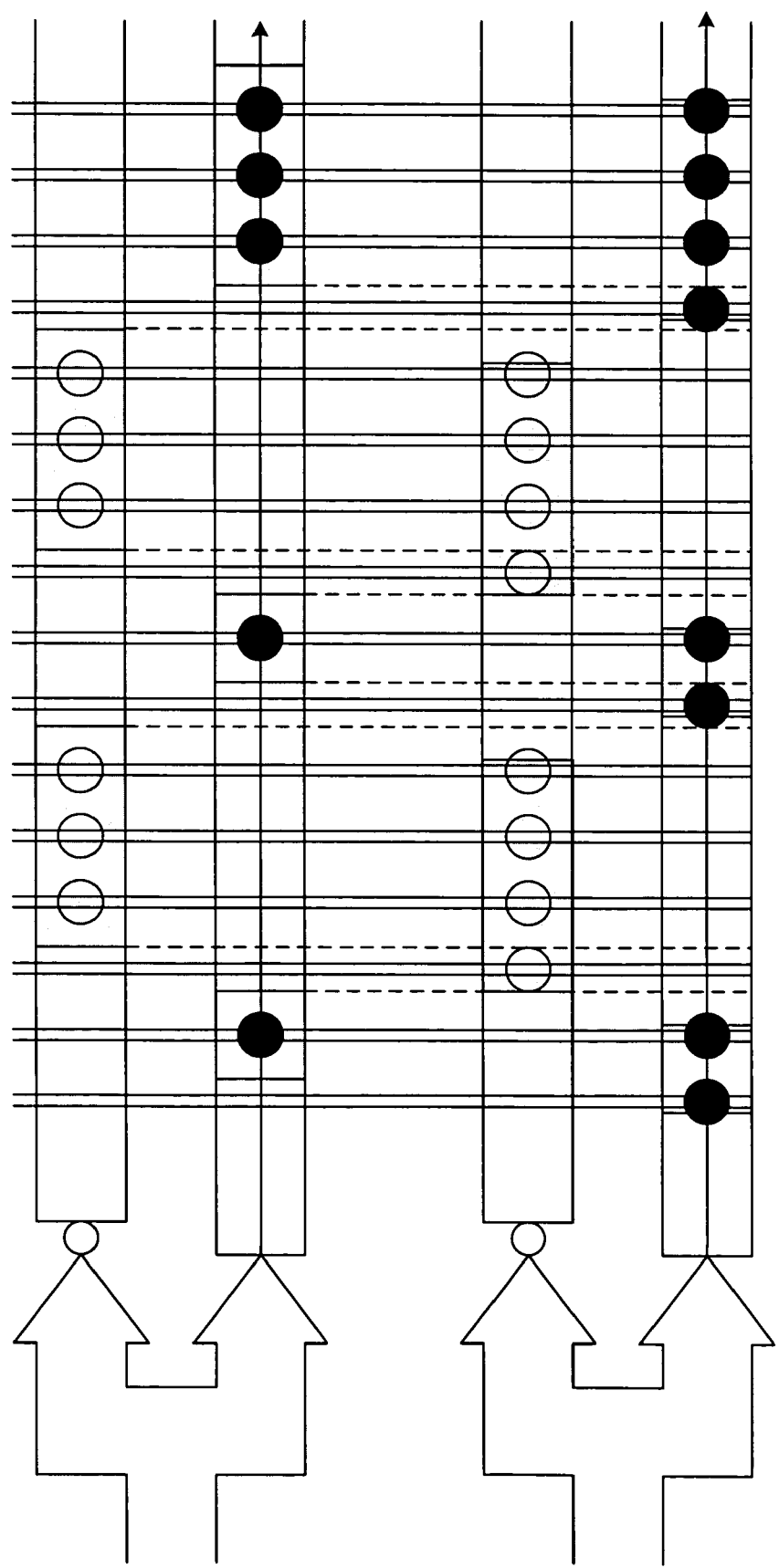

A third case arises when, rather than using minimally sized conductive windows on the supplemental address-signal-line pair, maximally sized windows are employed with lengths corresponding to the lengths of rightward-offset, adjacent conductive windows on the original complementary address-signal-line pair. FIGS. 16–17 illustrate the third case arising from a positioning of a set of parallel nanowires with respect to the conductive windows shown in FIG. 11. In FIG. 16, the set of nanowires is misaligned with respect to the conductive windows, such as conductive window 1106 on original address-signal line 1222. However, the corresponding conductive window 1602 on address-signal line 1214 is correctly positioned with respect to the set of nanowires. In the third case, the intended interconnection topology and addressability of the supplemental complementary address-signal-line pair 1104 is exactly that intended for the original complementary address-signal-line pair 1102. Therefore, in the third case, the supplemental complementary address-signal-line pair 1104 can be used in place of the original complementary address-signal-line pair 1102. FIG. 17 shows the same configuration as shown in FIG. 16, with address-signal lines having opposite states.

Thus, using the ranges of conductive-window lengths, and corresponding ranges of adjacent-conductive-window gaps, in the original complementary address-signal-line pairs of an interconnection interface, and by introducing a supplemental, complementary address-signal-line pair for each original complementary address-signal-line pair, a predefined, unique addressability of all covering nanowires can be obtained despite relative displacement of the set of covering nanowires with respect to the conductive windows fabricated on address-signal lines. Of course, if the set of nanowires is translationally displaced by a distance greater than its fundamental periodicity, then one or more nanowires may fail to be addressed. Thus, during manufacturing, if the nanowire alignment with respect to microscale address-signal lines can be controlled to within a single adjacent-nanowire interspacing distance, then simple testing can reveal which of the three possible cases, illustrated above in FIGS. 12–17, has been obtained, and a corresponding, unique addressability can be assigned to each nanowire. Otherwise, a slightly more involved testing must be used to determine which of a set of nanowires remains addressable, and the unique addresses that correspond to each nanowire. In all cases, a manufactured interconnection interfaces preserves unique addressability of all covering nanowires.

Although the present invention has been described in terms of a particular embodiment, it is not intended that the invention be limited to this embodiment. Modifications within the spirit of the invention will be apparent to those skilled in the art. For example, any number of different types of interconnection interfaces between microscale signal lines and nanowires, in which unique addressability of single nanowires or unique sets of nanowires is needed, can employ the present invention to guarantee unique addressing despite an inability to control the positioning of nanowires with respect to the length dimension of the microscale signal lines. In addition, the method can be applied to interconnections between sets of nanowires, between sets of nanowires and sets of submicroscale wires, and various other combinations of wires and elements of various dimensions. Variations on the conductive-window-length constraints may be employed to provide different, predictable patterns of nanowire conductivities to microscale signal lines in order to guarantee unique addressability of single nanowires or small, discrete, unique sets of nanowires. Although the above-described embodiment discussed conductive windows on microscale signal line, conductive windows are merely an example of a broader class of active regions fabricated on the circuitry to which a nanowire-circuit later interfaces. Active regions may constitute any regions of circuit elements that are, by chemical, electrical, mechanical, photochemical, or combination treatment, fabricated to have different junction properties when overlapped by nanowires than non-treated portions of the circuit elements, and may serve to directly electrically interconnect address signal lines with addressed signal lines, or may serve to gate voltage or current transmission by the addressed signal lines.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A nanoscale-circuit-containing interface comprising:
   a set of parallel, original, complementary address-signal-line pairs, each complementary address signal line pair representing a single address bit;
   a set of parallel nanowires approximately orthogonally oriented to the set of parallel, original, complementary address-signal-line pairs; and
   active regions on the address signal lines such that gaps between adjacent active regions on two address-signal lines of a complementary address-signal-line pair are greater than a width of a nanowire and less than a sum of a width of a nanowire and an interspacing between adjacent nanowires, the parallel nanowires controlled by the parallel, original, complementary address-signal-line pairs through the active regions.

2. The nanoscale-circuit-containing interface of claim 1 further including:
   for each original complementary address-signal-line pair, a corresponding, supplemental, complementary address-signal-line pair having active regions that alternate in sequence between the address-signal lines of the supplemental, complementary address-signal-line pair in order to fill, but not overlap, gaps between adjacent active regions on the original complementary address-signal-line pair.

3. The nanoscale-circuit-containing interface of claim 2 wherein nanowires can be uniquely addressed using, for each original complementary address-signal-line pair and corresponding supplemental, complementary address-signal-line pair, one of:
   the original complementary address-signal-line pair;
   the supplemental, complementary address-signal-line pair; and
   a combination of the original complementary address-signal-line pair and corresponding supplemental, complementary address-signal-line pair.

4. A nanoscale-circuit-containing interface comprising:
   a set of parallel, original, complementary addressing-element pairs, each complementary addressing-element pair representing a single address bit;
   a set of parallel nanoscale elements oriented non-parallel to the set of parallel, original, complementary addressing-element pairs; and
   a means for interconnecting the set of parallel, original, complementary addressing-element pairs to the set of parallel nanoscale elements so that the nanoscale elements are addressable by the addressing-elements despite the particular translational alignment of the nanoscale elements to the addressing-element pairs.

* * * * *